(12) United States Patent
Choi et al.

(10) Patent No.: US 11,839,839 B2
(45) Date of Patent: Dec. 12, 2023

(54) APPARATUS AND SYSTEM FOR FILTRATING LIQUID

(71) Applicant: XIA TAI XIN SEMICONDUCTOR (QING DAO) LTD., Qingdao (CN)

(72) Inventors: Sangyong Choi, Singapore (SG); Chang-Hyeon Nam, Singapore (SG); Injoon Yeo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 189 days.

(21) Appl. No.: 16/681,463

(22) Filed: Nov. 12, 2019

(65) Prior Publication Data

US 2020/0215466 A1    Jul. 9, 2020

Related U.S. Application Data

(60) Provisional application No. 62/778,925, filed on Dec. 13, 2018.

(51) Int. Cl.
| | |
|---|---|
| *B01D 29/50* | (2006.01) |
| *B01D 29/46* | (2006.01) |
| *B01D 29/60* | (2006.01) |
| *B01D 29/66* | (2006.01) |
| *H01L 21/67* | (2006.01) |
| *B01D 35/02* | (2006.01) |

(52) U.S. Cl.
CPC ............ *B01D 29/50* (2013.01); *B01D 29/46* (2013.01); *B01D 29/60* (2013.01); *B01D 29/66* (2013.01); *B01D 35/02* (2013.01); *H01L 21/67075* (2013.01); *B01D 2201/085* (2013.01); *B01D 2201/291* (2013.01); *B01D 2221/14* (2013.01)

(58) Field of Classification Search
None
See application file for complete search history.

(56) References Cited

U.S. PATENT DOCUMENTS

| | | | | |
|---|---|---|---|---|
| 3,933,654 A | * | 1/1976 | Middelbeek | B01D 17/0211 210/521 |
| 4,209,394 A | * | 6/1980 | Kelland | B01D 35/06 210/222 |
| 4,412,582 A | * | 11/1983 | Mecozzi | B01F 5/0606 165/159 |
| 4,699,211 A | * | 10/1987 | Geary | F28F 9/22 165/159 |
| 5,281,430 A | * | 1/1994 | Herron | A23F 5/28 426/490 |

(Continued)

FOREIGN PATENT DOCUMENTS

| | | |
|---|---|---|
| CN | 102397736 A | 4/2012 |
| CN | 204138821 U | 2/2015 |
| CN | 105415084 A | 3/2016 |

*Primary Examiner* — Robert J Popovics
(74) *Attorney, Agent, or Firm* — ScienBiziP, P.C.

(57) ABSTRACT

A filtration apparatus is provided. The filtration apparatus includes a housing and a plurality of filtering sheets. The housing is enclosed by a first end cap and a second end cap. The first end cap includes a liquid inlet, and the second end cap includes a liquid outlet. The plurality of filtering sheets is disposed on an internal sidewall of the housing. A portion of the filtering sheets interlaces with another portion of the filtering sheets to form a winding flow path in the housing.

17 Claims, 6 Drawing Sheets

(56) References Cited

U.S. PATENT DOCUMENTS

| | | | | |
|---|---|---|---|---|
| 5,824,223 A * | 10/1998 | Michaels | ............. | B01D 61/002 210/642 |
| 7,255,115 B2 * | 8/2007 | Kwon | ............... | H01L 21/67057 134/102.2 |
| 7,331,472 B2 * | 2/2008 | Seregin | ................. | B01D 17/00 210/521 |
| 8,034,289 B2 * | 10/2011 | Fletcher | .................... | C02F 1/02 422/38 |
| 8,337,706 B2 * | 12/2012 | McCabe | ........... | B01D 21/2494 210/702 |
| 8,518,268 B1 * | 8/2013 | Nauertz | ............... | B01D 21/003 210/738 |
| 8,646,470 B2 * | 2/2014 | Bajema | ................ | A23N 12/023 134/182 |
| 9,464,847 B2 * | 10/2016 | Maurer | ................ | F28F 13/003 |
| 9,612,058 B2 * | 4/2017 | Singh | ........................ | F28D 7/10 |
| 9,951,997 B2 * | 4/2018 | Maurer | ..................... | F28D 3/02 |
| 2007/0246433 A1 * | 10/2007 | Zuberi | ................. | B01D 53/945 210/749 |
| 2009/0095690 A1 * | 4/2009 | McCabe | ............... | B01D 21/302 210/744 |
| 2010/0116756 A1 * | 5/2010 | Fletcher | .................... | C02F 1/02 210/775 |
| 2010/0140160 A1 * | 6/2010 | Dubrow | ............... | B01J 20/3204 210/348 |
| 2011/0233144 A1 * | 9/2011 | McCabe | ............... | B01D 21/302 210/748.16 |
| 2012/0006762 A1 * | 1/2012 | McCabe | ............ | B01D 17/0211 210/801 |
| 2013/0126448 A1 * | 5/2013 | McCabe | ................. | C02F 1/302 210/801 |
| 2016/0075583 A1 * | 3/2016 | McCabe | ............... | B01D 19/0063 210/748.02 |
| 2020/0215466 A1 * | 7/2020 | Choi | ....................... | B01D 29/60 |

* cited by examiner

US 11,839,839 B2

APPARATUS AND SYSTEM FOR FILTRATING LIQUID

CROSS REFERENCE TO RELATED APPLICATION(S)

The present application claims the benefit of and priority to a U.S. Provisional Application No. 62/778,925, filed on Dec. 13, 2018, the entire content of which is incorporated herein by reference.

FIELD

The present disclosure relates to semiconductor fabrication and more particularly to an apparatus for filtrating a liquid used in wafer etch process.

BACKGROUND

When wet etch process is performed to strip silicon nitride, the concentration of silicon oxide ($SiO_2$; also known as silica) in the etchant would increase, therefore reducing the selectivity of the etchant over nitride. In order to ensure the quality of the resulting semiconductor wafer, the etchant would be discharged in half or replaced entirely after each batch process. On average, the time to replace the entire etchant is 30 minutes. Therefore, discharging or replacement of the etchant would increase both the cost and downtime.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a filtration apparatus is provided. The filtration apparatus includes a housing and a plurality of filtering sheets. The housing is enclosed by a first end cap and a second end cap. The first end cap includes a liquid inlet, and the second end cap includes a liquid outlet. The plurality of filtering sheets are disposed on an internal sidewall of the housing. A portion of the plurality of filtering sheets interlaces with another portion of the plurality of filtering sheets to form a winding flow path in the housing.

In another example, a filtration system is provided. The filtration system includes a wafer processing module and at least one filtration apparatus connected to the wafer processing module. The at least one filtration apparatus includes a housing and a plurality of filtering sheets. The housing is enclosed by a first end cap and a second end cap. The first end cap includes a liquid inlet, and the second end cap includes a liquid outlet. The plurality of filtering sheets are disposed on an internal sidewall of the housing. A portion of the plurality of filtering sheets interlaces with another portion of the plurality of second filtering sheets to form a winding flow path in the housing.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1A:
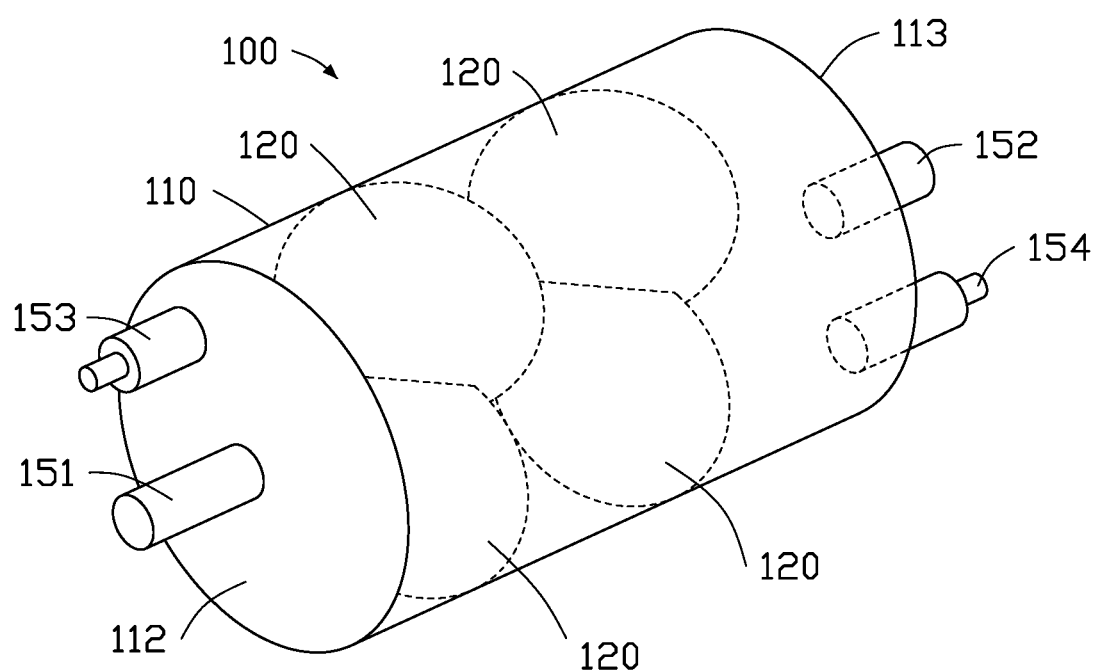
FIG. 1A is a perspective view of a filtration apparatus in accordance with an implementation of the present disclosure.

To facilitate an understanding of the principles and features of the various implementations of the present disclosure, various illustrative implementations are explained below. Although exemplary implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIG. 1A illustrates a perspective view of a filtration apparatus 100 in accordance with an implementation of the present disclosure. The filtration apparatus 100 includes a housing 110, a first end cap 112 enclosing an end of the housing 110, a second end cap 113 enclosing another end of the housing 110, and a plurality of filtering sheets 120 disposed in the housing 110. The housing 110, the first end cap 112, and the second end cap 113 may be formed of polytetrafluoroethylene (PTFE, sold under the tradename of Teflon®). The housing 110 may have a tubular structure. The first end cap 112 includes a liquid inlet 151, and the second end cap 113 includes a liquid outlet 152. In some implementations, the first end cap 112 further include a gas inlet 153, and the second end cap 113 further include a gas outlet 154.

Figure 1B:
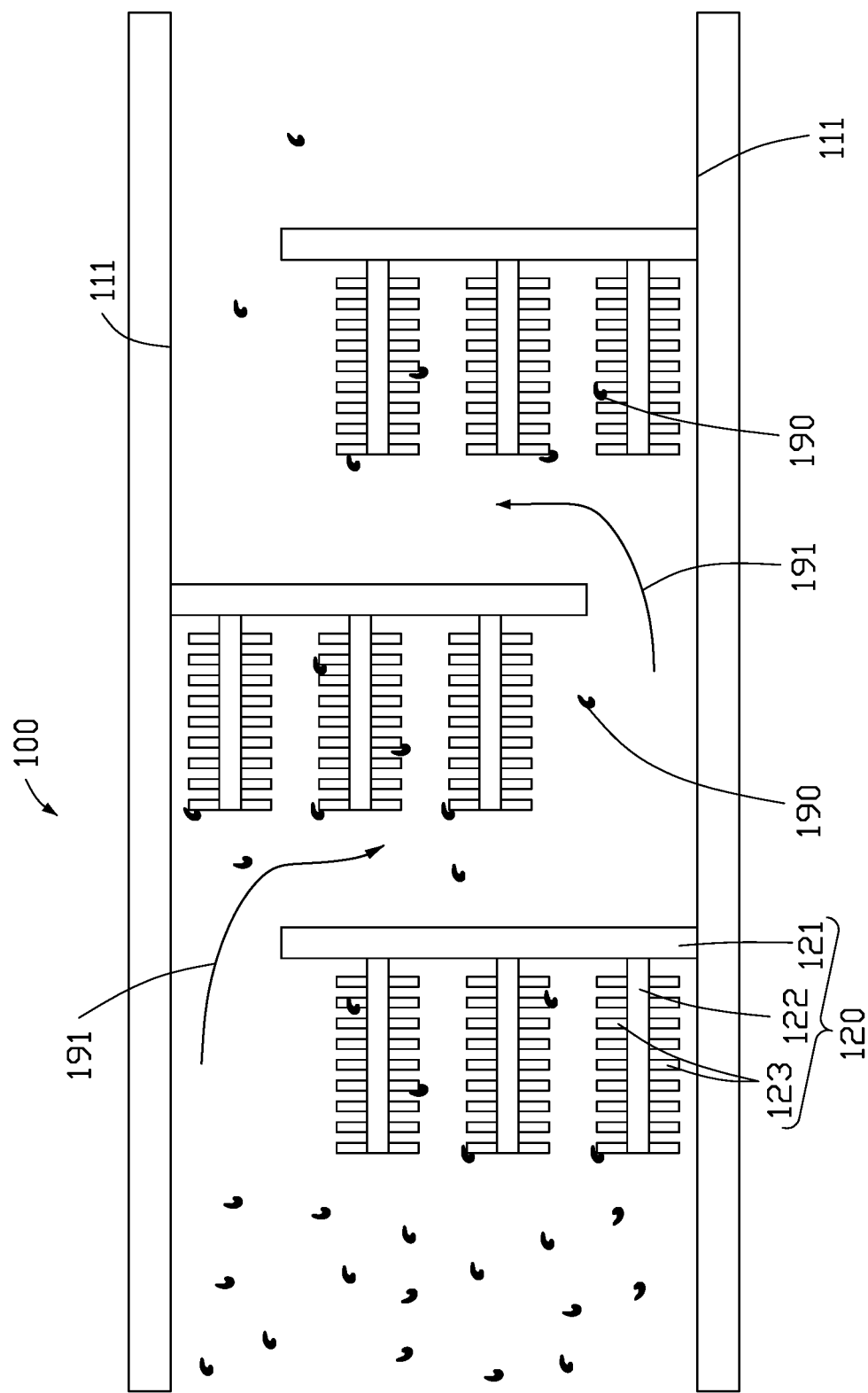
FIG. 1B is a cross-sectional view of the filtration apparatus of FIG. 1A.

As shown in FIG. 1B, which illustrates a cross-sectional view of the filtration apparatus 100, the plurality of filtering sheets 120 are disposed on an internal sidewall 111 of the housing 110 so as to form a winding flow path 191 in the housing 110. A portion of the filtering sheets 120 interlaces with another portion of the filtering sheets 120 to form the winding flow path 191. In some implementations, each of the plurality of filtering sheets 120 is perpendicular to the internal sidewall 111.

Still referring to FIG. 1B, each of the plurality of filtering sheets 120 may include a substrate 121 extending from the internal sidewall 111, preferably in a vertical direction. The substrate 121 may be formed of silicon. A semiconductor pattern is disposed on a surface of the substrate 121 facing the first end cap 112. For the purpose of clarification, the size of the semiconductor pattern is enlarged in FIG. 1B. The semiconductor pattern may have a brush structure including a stem 122 and bristle-like arrays 123. The stem 122 and the bristle-like arrays 123 may be formed by oxide-based materials. In some examples, the substrate 121 may include semiconductor patterns on both surfaces of the substrate 121.

In some implementations, a liquid 190, e.g., a phosphoric acid containing silicon dioxide, is injected into the filtration apparatus 100 through the liquid inlet 151. As the liquid 190 flows along the flow path 191, silicon dioxide in the liquid 190 may be captured by the semiconductor pattern on the plurality of filtering sheets 120, causing a concentration of silicon dioxide in the liquid to decrease. As shown in FIG. 1B, the winding flow path 191 may increase the contact time between the plurality of filtering sheets 120 and the liquid flowing within the housing 110. Accordingly, silicon dioxide is efficiently filtered by the filtration apparatus 100.

Figure 1C:
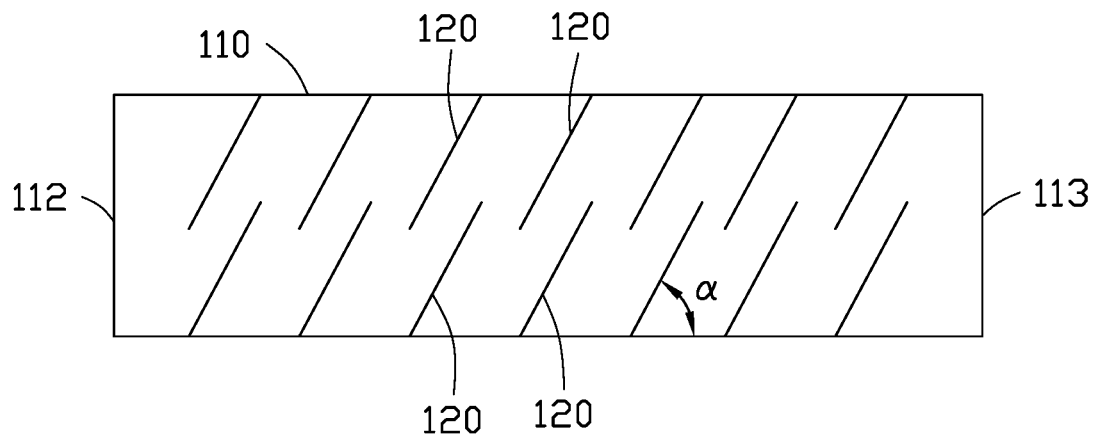
FIG. 1C is a cross-sectional view of a filtration apparatus in accordance with another implementation of the present disclosure.

FIG. 1C illustrates a cross-sectional view of the filtration apparatus 100 having inclined filtering sheets. For example, at least a portion of the plurality of filtering sheets 120 may incline toward the second end cap 113, whereas at least another portion of the plurality of filtering sheets 120 may incline toward the first end cap 112. An angle α formed between the internal sidewall 111 and each of the plurality of filtering sheets 120 may fall within the range of 0 to 90 degrees.

Figure 1D:
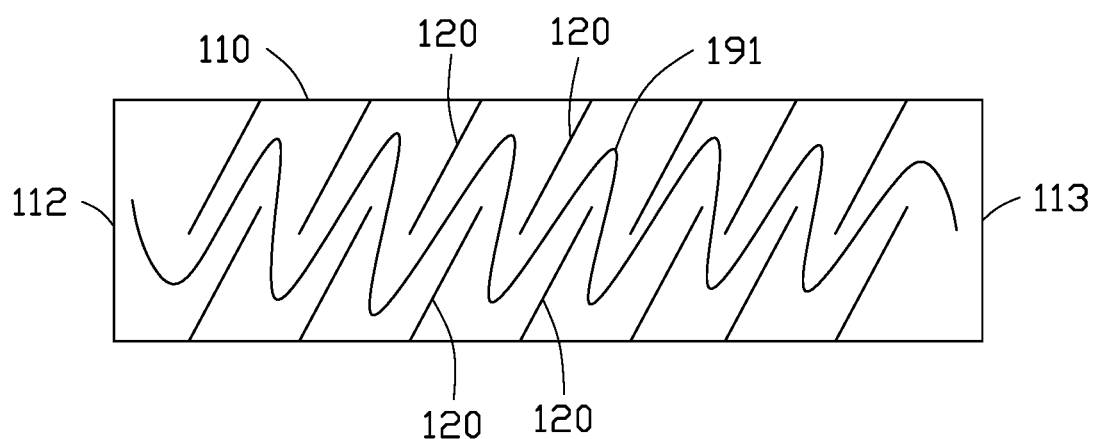
FIG. 1D is a schematic flow path in the filtration apparatus in accordance with an implementation of the present disclosure.

FIG. 1D illustrates a schematic flow path in the filtration apparatus 100. The winding flow path 191 may have a zig-zag or helical structure.

Figure 2A:
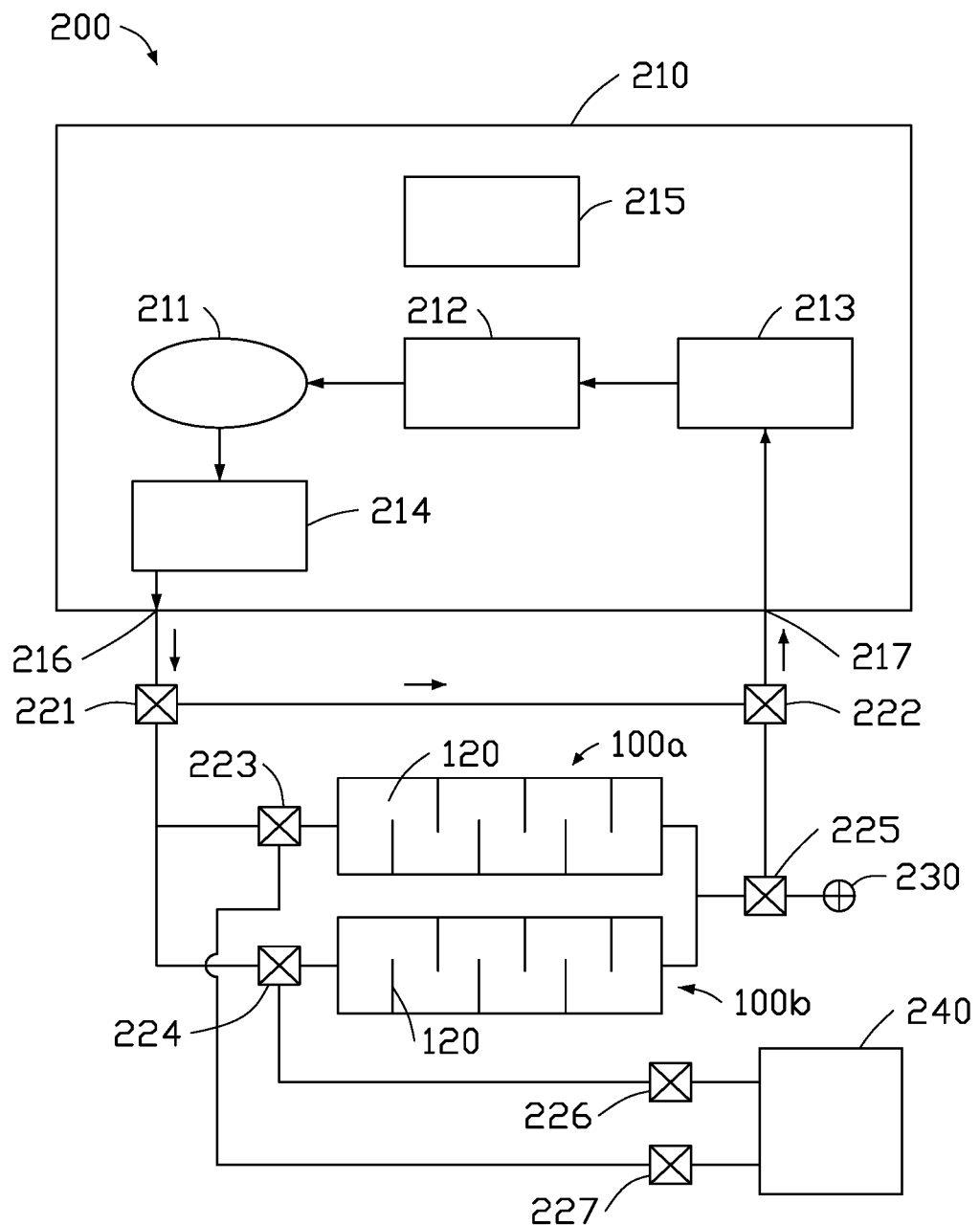
FIG. 2A is a configuration of a filtration system in a regular mode in accordance with an implementation of the present disclosure.
Figure 2B:
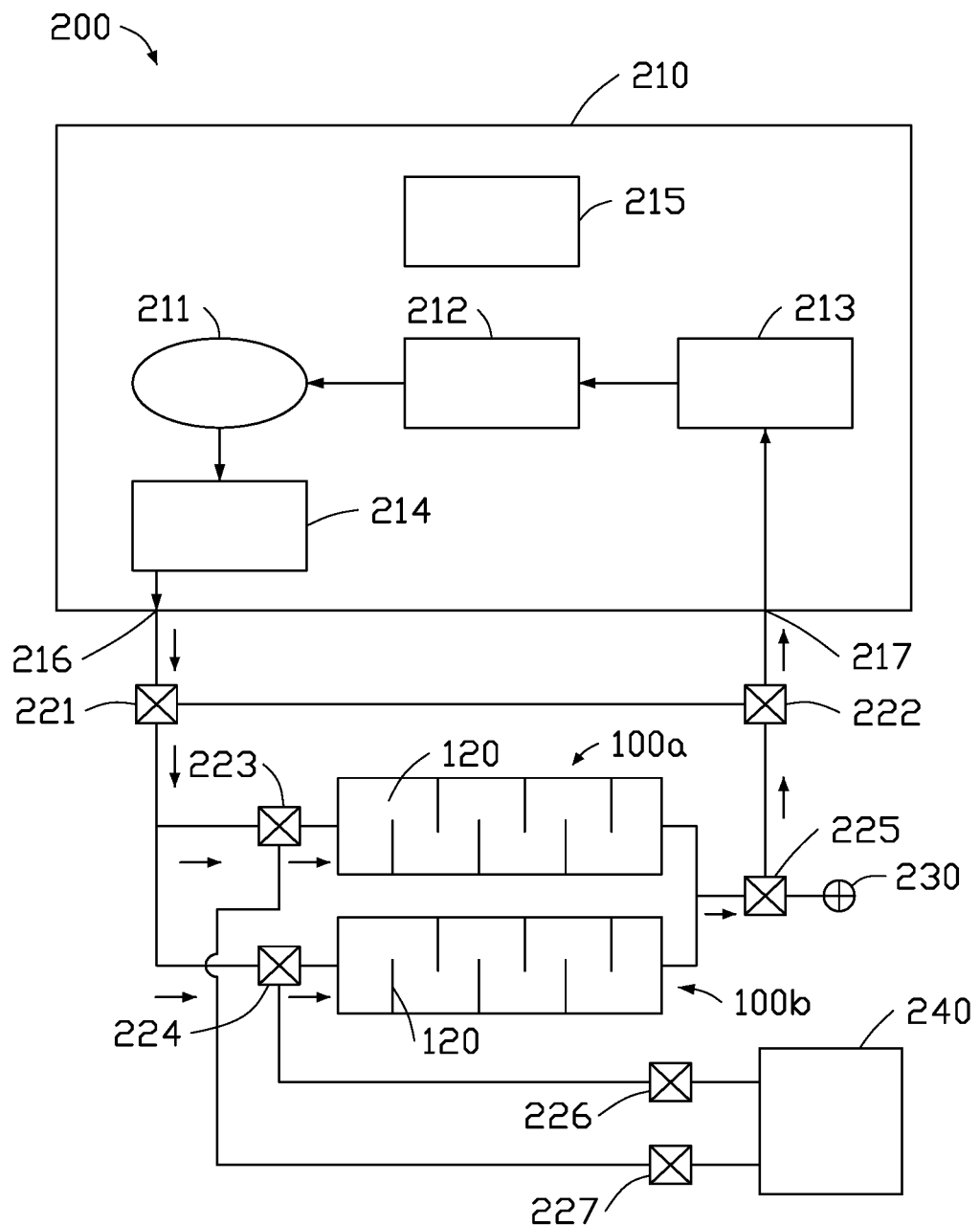
FIG. 2B is a configuration of the filtration system in a filtration mode in accordance with an implementation of the present disclosure.
Figure 2C:
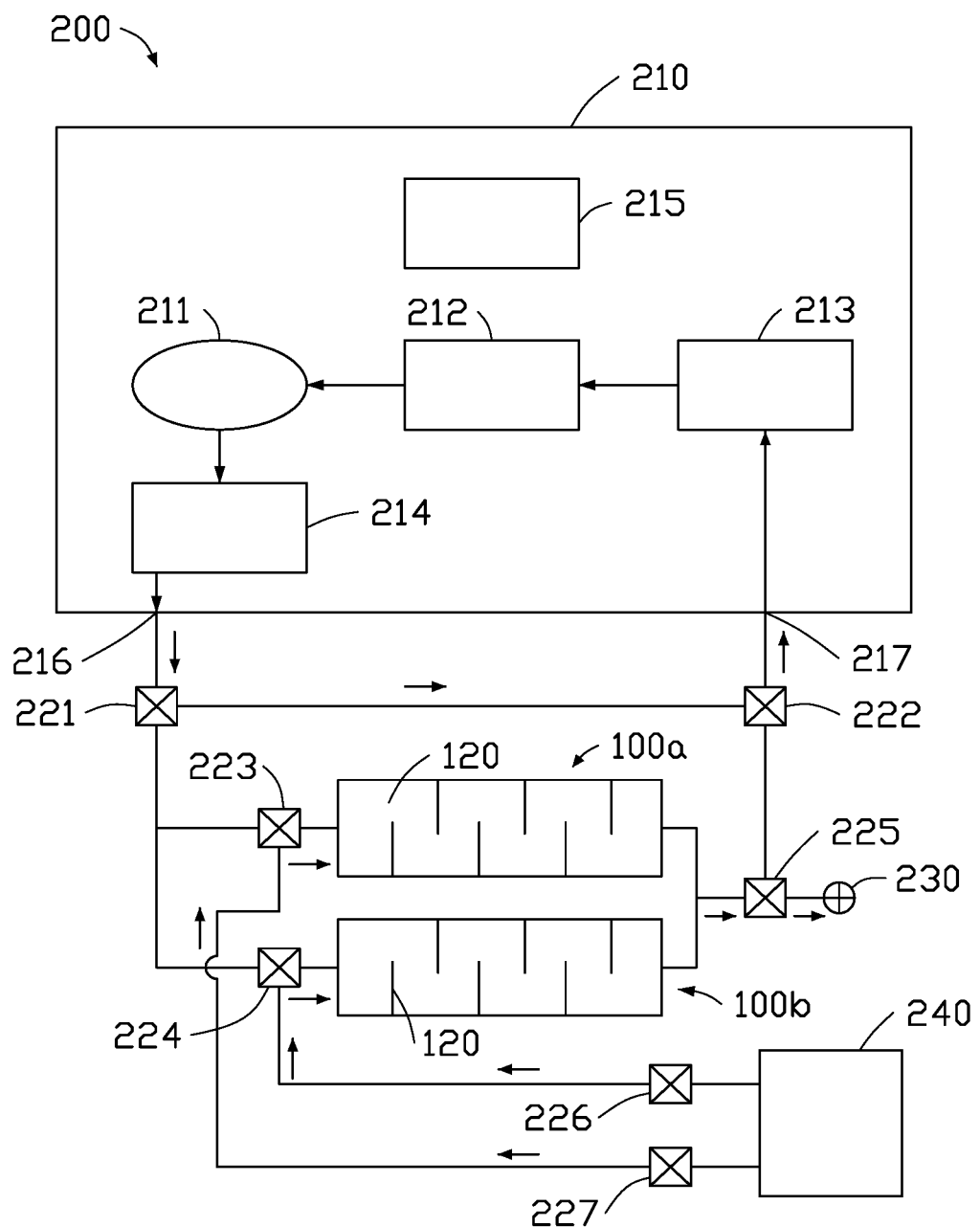
FIG. 2C is a configuration of the filtration system in a cleaning mode in accordance with an implementation of the present disclosure.

FIGS. 2A to 2C illustrate configurations of a filtration system 200 for filtrating a liquid in accordance with an implementation of the present disclosure. The filtration system 200 includes a wafer processing module 210 for performing a wet etch process, at least one filtration apparatus 100a, 100b for filtrating an etchant used in the wet etch process, a liquid supplier 240 for supplying a cleaning agent to clean the filtration apparatus 100a, 100b, and a control unit 215 for switching operation modes of the filtration system 200. The amount of the filtration apparatus is preferably two.

The wafer processing module 210 includes an etching device 211 for processing a batch of wafers by a wet etch process, a heater 213 for heating the etchant, a concentration meter 212 for monitoring a concentration of a target chemical in the etchant, and a pump 214 for pumping the etchant out of the etching device 211. The heater 213 may be connected to a liquid input 217 of the wafer processing module 210. The concentration meter 212 may be disposed between the etching device 211 and the heater 213. The pump 214 may be connected to a liquid output 216 of the wafer processing module 210. In some implementations, the etchant in the wafer processing module 210 flows through the liquid input 217, the heater 213, the concentration meter 212, the etching device 211, the pump 214, and the liquid output 216.

In some implementations, the filtration system 200 includes valves 221, 222, 223, 224, 225, 226, 227. For example, the valves 221-227 are three-way valves. The valve 221 may be connected to the liquid output 216 and the valves 222, 223, 224. The valve 222 may be connected to the liquid input 217 and the valves 221, 225. The valve 223 may be connected to the filtration apparatus 100a and the valves 221, 227. The valve 224 may be connected to the filtration apparatus 100b and the valves 221, 226. The valve 225 may be connected to the filtration apparatuses 100a and 100b, a drain 230, and the valve 222.

Referring to FIG. 2A, the filtration system 200 is operated under a regular mode. If a concentration of a chemical (e.g., $SiO_2$) in the etchant monitored by the concentration meter 212 is below a predetermined value, the control unit 215 may guide the etchant to flow through the liquid output 216, the valve 221, the valve 222, and the liquid input 217.

Referring to FIG. 2B, the filtration system 200 is operated under a filtration mode. If the concentration of $SiO_2$ in the etchant monitored by the concentration meter 212 exceeds the predetermined value, the control unit 215 may guide the etchant to flow through the liquid output 216, the valves 223 and 224, the filtration apparatuses 100a, 100b, the valve 225, the valve 222, and the liquid input 217. In the filtration mode, the wet etch process continues while the filtration apparatuses 100a, 100b filter $SiO_2$ according to manners described in FIGS. 1A to 1C. In some implementations, the control unit 215 may allow the etchant to synchronously flow from the valve 221 to the valve 222, i.e., filtered etchant and non-filtered etchant may be combined at the valve 222 and then flow back to the liquid input 217.

Referring to FIG. 2C, the filtration system 200 is operated under a cleaning mode. When the filtration capability of the filtration apparatuses 100a, 100b reduces, the control unit may switch the system 200 to the clean mode for cleaning the filtration apparatuses 100a, 100b. For example, if a recovering rate (such as a reduction rate of the concentration of $SiO_2$ in the filtration mode) is below a threshold, the control unit 215 may perform the actions of: (1) guiding the etchant to flow through the liquid output 216, the valve 221, the valve 222, and the liquid input 217; while (2) supplying a cleaning agent from the liquid supplier 240 to the filtration apparatuses 100a, 100b via the valves 226, 227 and the valves 224, 223 for a predetermined duration; (3) draining the cleaning agent from the filtration apparatuses 100a, 100b to the drain 230; and (4) supplying water from the liquid supplier 240 to rinse the filtration apparatuses 100a, 100b. The drain 230 may collect the cleaning agent and the water. The control unit 215 may independently clean one of the filtration apparatus 100a, 100b by controlling the valves 226 and 227.

In some implementations, the cleaning agent may be a hydrofluoric acid (HF) solution. HF reacts with $SiO_2$ to produce silicon tetrafluoride and water. When $SiO_2$ captured by the plurality of filtering sheets 120 is removed from the filtering sheets 120, the filtration capability of the filtration apparatuses 100a, 100b is restored.

According to the exemplary implementations of the present disclosure, since the filtration system allows the wet etch process and the filtration process to be performed simultaneously, the down time (e.g., replacing the etchant) is decreased. Moreover, the filtration apparatus of the filtration system has self-cleaning capability, therefore reducing the cost of replacing the etchant The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A filtration apparatus comprising:
   a housing enclosed by a first end cap and a second end cap, the first end cap comprising a liquid inlet, and the second end cap comprising a liquid outlet; and
   a plurality of filters disposed on an internal sidewall of the housing,
   wherein a portion of the filters interlaces with another portion of the filters to form a winding flow path in the housing, each of the filters comprises a substrate extending from the internal sidewall and extending toward the other side of the internal sidewall, and at least one brush structure is disposed on a surface of the substrate, each of the at least one brush structure comprises a stem and branches protruding from the stem towards the internal sidewall.

2. The filtration apparatus of claim 1, wherein the housing has a tubular structure.

3. The filtration apparatus of claim 1, wherein each of the plurality of filters is perpendicular to the internal sidewall.

4. The filtration apparatus of claim 1, wherein an angle formed between the internal sidewall and each of the plurality of filters falls within the range of 0 to 90 degrees.

5. The filtration apparatus of claim 1, wherein the brush structure is used to capture silicon dioxide.

6. The filtration apparatus of claim 5, wherein the brush structure is formed by an oxidebased material.

7. The filtration apparatus of claim 1, wherein the first end cap further comprises a gas inlet, and the second end cap further comprises a gas outlet.

8. A filtration system comprising:
   a wafer processing module, comprising:
     an etching device;
     a heater connected to the liquid input;
     a concentration meter disposed between the heater and the etching device; and
     a pump disposed between the etching device and the liquid output;
   a first valve connected to a liquid output of the wafer processing module;
   a second valve connected to a liquid input of the wafer processing module; and
   at least one filtration apparatus connected to the wafer processing module, the at least one filtration apparatus comprising:
     a housing enclosed by a first end cap and a second end cap, the first end cap comprising a liquid inlet, and the second end cap comprising a liquid outlet; and
     a plurality of filters disposed on an internal sidewall of the housing,
   wherein a portion of the filters interlaces with another portion of the filters to form a winding flow path in the housing, each of the filters comprises a substrate disposing on the internal sidewall and extending toward the other side of the internal sidewall, and at least one brush structure is disposed on a surface of the substrate, each of the at least one brush structure comprises a stem and branches protruding from the stem towards the internal sidewall.

9. The filtration system of claim 8, wherein the liquid inlet is configured to receive a liquid from the first valve.

10. The filtration system of claim 9, wherein the liquid is a phosphoric acid solution.

11. The filtration system of claim 8, wherein the liquid outlet is configured to supply a filtrated liquid to the second valve.

12. The filtration system of claim 8, wherein the first valve and the second valve are three-way valves.

13. The filtration system of claim 8, further comprising:
    a liquid supplier connected to the at least one filtration apparatus for supplying a cleaning agent; and
    a drain for collecting the cleaning agent.

14. The filtration system of claim 13, further comprising a third valve disposed between the liquid supplier and the liquid inlet, and a fourth valve disposed between the liquid outlet and the drain.

15. The filtration system of claim 8, wherein each of the plurality of filters is perpendicular to the internal sidewall of the housing.

16. The filtration system of claim 8, wherein the brush structure is used to capture silicon dioxide.

17. The filtration system of claim 8, further comprising a control circuit for switching operation modes of the system.

* * * * *